(12) United States Patent  
Jung et al.

(10) Patent No.: US 8,975,089 B1
(45) Date of Patent: Mar. 10, 2015

(54) METHOD FOR FORMING MTJ MEMORY ELEMENT

(71) Applicant: Avalanche Technology Inc., Fremont, CA (US)

(72) Inventors: Dong Ha Jung, Pleasanton, CA (US); Kimihiro Satoh, Beaverton, OR (US); Jing Zhang, Los Altos, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/082,400

(22) Filed: Nov. 18, 2013

(51) Int. Cl.
*H01L 43/12* (2006.01)
*H01L 43/02* (2006.01)

(52) U.S. Cl.
CPC ............... *H01L 43/12* (2013.01); *H01L 43/02* (2013.01)
USPC ........ 438/3; 438/785; 257/295; 257/E43.001; 257/E29.167

(58) Field of Classification Search
CPC .................................................. H01L 27/222
USPC .......................... 257/295, E43.001–E43.007, 257/E27.005–E27.006, E27.008, E29.164, 257/E29.167, E29.272, E29.323; 438/3, 438/785
See application file for complete search history.

(56) References Cited

U.S. PATENT DOCUMENTS

| | | | | |
|---|---|---|---|---|
| 2013/0029431 A1* | 1/2013 | Takahashi et al. | ................. | 438/3 |
| 2013/0267042 A1* | 10/2013 | Satoh et al. | ........................ | 438/3 |
| 2013/0316536 A1* | 11/2013 | Seto et al. | ..................... | 438/689 |
| 2014/0087483 A1* | 3/2014 | Ohsawa et al. | ................... | 438/3 |
| 2014/0170776 A1* | 6/2014 | Satoh et al. | ........................ | 438/3 |
| 2014/0198564 A1* | 7/2014 | Guo | ............................. | 365/158 |
| 2014/0227801 A1* | 8/2014 | Hsu et al. | .......................... | 438/3 |

* cited by examiner

*Primary Examiner* — Mamadou Diallo
(74) *Attorney, Agent, or Firm* — Bing K. Yen

(57) ABSTRACT

The present invention is directed to a method for forming a magnetic tunnel junction (MTJ) memory element comprising the steps of providing a substrate having a bottom electrode layer thereon; depositing an MTJ layer stack on top of the bottom electrode layer; forming a composite hard mask comprising a bottom conducting mask disposed on top of the MTJ layer stack and a top conducting mask with a dielectric mask interposed therebetween; etching the MTJ layer stack with the composite hard mask thereon to form a patterned MTJ while consuming the top conducting mask, thereby exposing the dielectric mask on top; and trimming the patterned MTJ with the bottom conducting mask and the dielectric mask thereon by ion beam etching to remove redeposited material and damaged material from surface of the patterned MTJ while consuming most of the dielectric mask.

20 Claims, 5 Drawing Sheets

METHOD FOR FORMING MTJ MEMORY ELEMENT

BACKGROUND

The present invention relates to spin transfer torque magnetic random access memory (STT-MRAM), and more particularly, to a method for using a composite hard mask for fabricating a magnetic tunnel junction (MTJ) memory element.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection transistor coupled in series between appropriate electrodes. Upon application of an appropriate write current to the magnetic memory element, the electrical resistance of the magnetic memory element would change accordingly, thereby switching the stored logic in the respective memory cell.

The magnetic memory element typically includes a magnetic reference layer and a magnetic free layer with an insulating tunnel barrier or junction layer interposed therebetween, thereby collectively forming a magnetic tunneling junction (MTJ). The magnetic reference layer has a fixed magnetization direction and may be anti-ferromagnetically exchange coupled to a magnetic pinned layer, which has a fixed but opposite or anti-parallel magnetization direction. Upon the application of an appropriate write current through the MTJ, the magnetization direction of the magnetic free layer can be switched between two directions: parallel and anti-parallel with respect to the magnetization direction of the magnetic reference layer. The insulating tunnel junction layer is normally made of a dielectric material with a thickness ranging from a few to a few tens of angstroms. When the magnetization directions of the magnetic free and reference layers are substantially parallel, electrons polarized by the magnetic reference layer can tunnel through the insulating tunnel junction layer, thereby decreasing the electrical resistivity of the MTJ. Conversely, the electrical resistivity of the MTJ is high when the magnetization directions of the magnetic reference and free layers are substantially anti-parallel. Accordingly, the stored logic in the magnetic memory element can be switched by changing the magnetization direction of the magnetic free layer.

Based on the relative orientation between the magnetic layers and the magnetization directions thereof, an MTJ can be classified into one of two types: in-plane MTJ, the magnetization directions of which lie substantially within planes parallel to the layer plane, or perpendicular MTJ, the magnetization directions of which are substantially perpendicular to the layer plane.

FIGS. 1A and 1B illustrate selected stages of a conventional process for forming an MTJ memory element as viewed from cross sections thereof. FIG. 1A shows a substrate 50 having a bottom electrode layer 52 thereon, a magnetic tunnel junction (MTJ) layer stack 54 formed on top of the bottom electrode layer 52, a capping layer 56 formed on top of the magnetic tunnel junction layer stack 54, and a metal hard mask 58 formed on top of the top electrode layer 56. The bottom electrode layer 52, the MTJ layer stack 54, and the capping layer 56, are then dry etched with the metal hard mask 58 thereon to form a MTJ memory element as illustrated in FIG. 1B. The dry etching process is normally carried out with a plasma etching process that utilizes a reactive gas chemistry, which would react with the side wall of the MTJ stack 54' to form a damaged layer 60. The damage layer 60 can significantly degrade the tunneling magnetoresistance ratio, especially when the size of the MTJ stack 54' decreases.

For the foregoing reasons, there is a need for a manufacturing method that can produce MTJ memory elements with minimal damages thereto.

SUMMARY

The present invention is directed to a method that satisfy this need. A method for forming a magnetic tunnel junction (MTJ) memory element comprises the steps of providing a substrate having a bottom electrode layer thereon; depositing a MTJ layer stack on top of the bottom electrode layer; forming a composite hard mask comprising a bottom conducting mask disposed on top of the MTJ layer stack and a top conducting mask with a dielectric mask interposed therebetween; etching the MTJ layer stack with the composite hard mask thereon to form a patterned MTJ and a bottom electrode while consuming the top conducting mask to expose the dielectric mask on top; and trimming the patterned MTJ with the bottom conducting mask and the dielectric mask thereon by ion beam etching to remove redeposited material and damaged material from surface of the patterned MTJ while consuming most of the dielectric mask.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features, including method steps, of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

Figure 2:
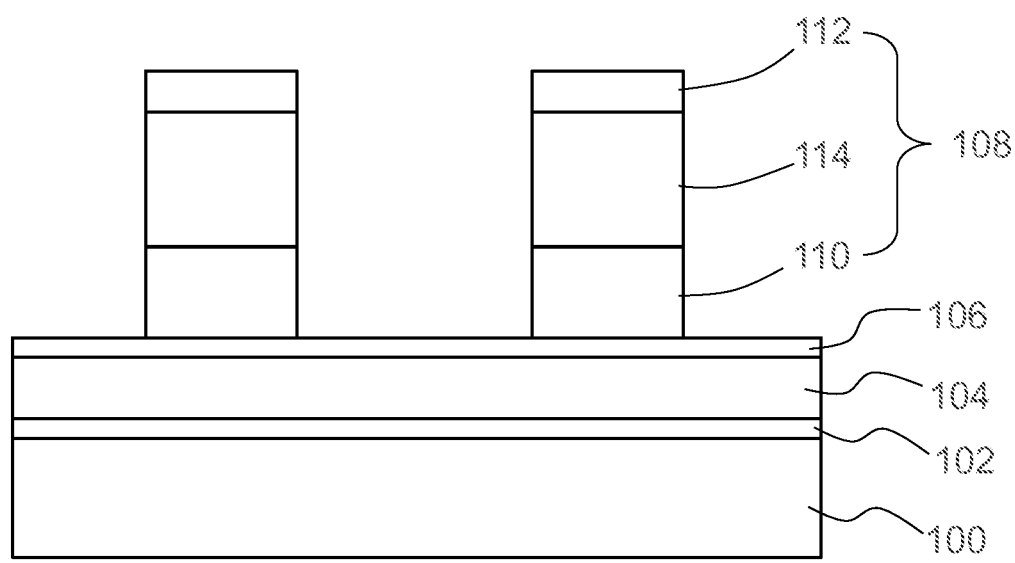
FIGS. 2-5 are cross sectional views illustrating various stages in formation of an MTJ memory element according to a method embodiment of the present invention.

An embodiment of the present invention as applied to formation of an MTJ memory element will now be described with reference to FIGS. 2-5. Referring now to FIG. 2, the processing begins by providing a substrate 100 with a bottom electrode layer 102 thereon. The substrate 100 may include other components (not shown) needed for operating the MTJ element, such as but not limited to logic and selection transistors. The bottom electrode layer 102 may be formed of any suitable conductor material, such as but not limited to titanium, zirconium, hafnium, vanadium, niobium, tantalum, chromium, molybdenum, tungsten, titanium nitride, zirconium nitride, hafnium nitride, niobium nitride, tantalum nitride, tungsten nitride, or any combination thereof. A MTJ layer stack 104 is deposited on top of the bottom electrode 102. The MTJ layer stack 104 may comprise a magnetic reference layer and a magnetic free layer with an insulating tunnel junction layer interposed therebetween and may have in-plane or perpendicular magnetic anisotropy. The MTJ stack layer 104 may also include a pinned magnetic layer anti-ferromagnetically exchange coupled to the magnetic reference layer via an anti-ferromagnetic coupling layer. The MTJ stack layer 104 may also include other magnetic and non-magnetic layers, such as but not limited to magnetic pinning layer, magnetic fixed layer, magnetic balance layer, magnetic assist layer, non-magnetic spacer layer, and non-magnetic perpendicular enhancement layer. An optional capping layer 106 may be deposited on top of the MTJ layer stack 104. The optional capping layer 106 may be formed of any suitable conductor material, such as but not limited to ruthenium, titanium, zirconium, hafnium, vanadium, niobium, tantalum, chromium, molybdenum, tungsten, titanium nitride, zirconium nitride, hafnium nitride, niobium nitride, tantalum nitride, tungsten nitride, or any combination thereof.

A composite hard mask 108, which includes a bottom mask 110 and a top mask 112 with a dielectric mask 114 interposed therebetween, is formed on top of the MTJ layer stack 104 for patterning the stack 104. In embodiments where the capping layer 106 is used, the composite hard mask 108 is formed on top of the capping layer 106. The composite hard mask 108 may be fabricated by forming a resist pattern by photo lithography and then transferring the resist pattern to composite hard mask layers by dry etching. The bottom mask 110 of the composite hard mask 108 may serve as a via for connecting the patterned MTJ to wiring above. The bottom mask 110 may be formed of any suitable conductor material, such as but not limited to titanium, zirconium, hafnium, vanadium, niobium, tantalum, chromium, molybdenum, tungsten, titanium nitride, zirconium nitride, hafnium nitride, niobium nitride, tantalum nitride, tungsten nitride, or any combination thereof. The dielectric mask 114 may be formed of any suitable dielectric material that has a good etch resistance against a dry etching process that utilizes an inert gas chemistry, such as but not limited to aluminum oxide, silicon oxide, silicon nitride, zirconium oxide, hafnium oxide, or any combination thereof. The top mask 114 serves as the main mask for etching the MTJ layer stack 104 and may be formed of any suitable conductor that is etch resistant, such as but not limited to titanium, zirconium, hafnium, vanadium, niobium, tantalum, chromium, molybdenum, tungsten, titanium nitride, zirconium nitride, hafnium nitride, niobium nitride, tantalum nitride, tungsten nitride, or any combination thereof.

Figure 3:
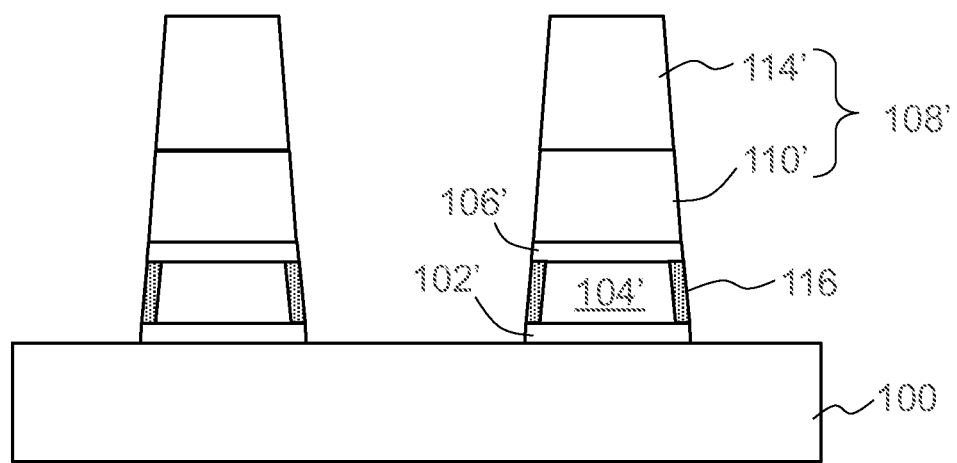

The processing continues by forming a bottom electrode 102', a patterned MTJ 104', and an optional patterned capping layer 106' by etching the bottom electrode layer 102, the MTJ layer stack 104, and the optional capping layer 106, respectively, using a reactive plasma etching process, resulting in the structure illustrated in FIG. 3. The MTJ etching process consumes the top mask 112 but leaves the dielectric mask 114' and the bottom mask 110' mostly intact. The reactive plasma etching process may be carried out using a gas chemistry comprising methanol. The reactive plasma etching process may also be carried out using a gas chemistry comprising carbon dioxide and hydrogen or carbon monoxide and hydrogen. Dielectric materials typically are not as etch resistant compared with metallic materials in the MTJ etching gas chemistry. Accordingly, the top mask 112, which serves as the primary mask for etching the patterned MTJ 104', is preferably made of a conductor as described above. The reaction between the MTJ layer material and the reactive gas chemistry used for etching the MTJ layer material would result in the formation of a reaction layer or damaged layer 116 on the side wall of the patterned MTJ 104', which may degrade the tunneling magnetoresistance ratio.

Figure 4:
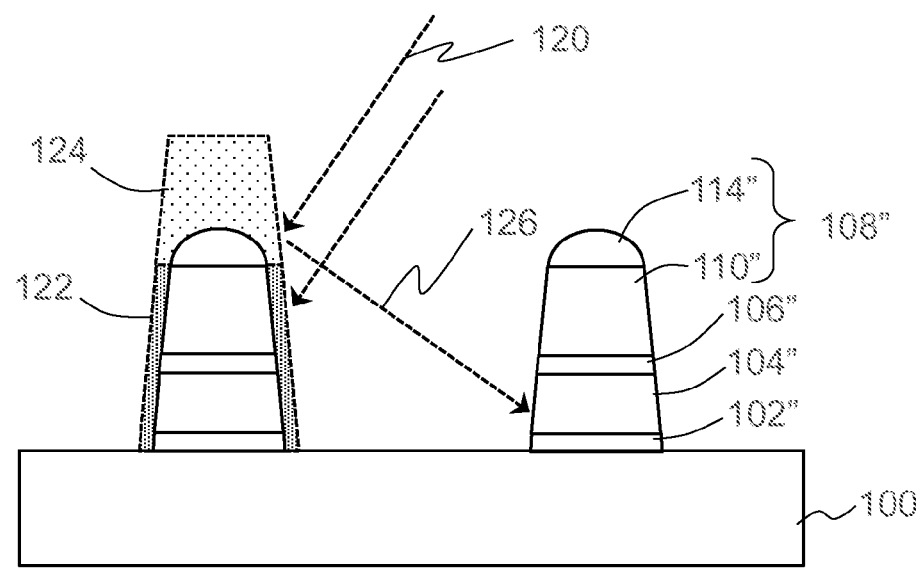

After formation of the patterned MTJ 104' by reactive plasma etching, the surface of the patterned MTJ 104' is trimmed or cleaned with a ion beam etching process that utilizes an inert gas chemistry, as illustrated in FIG. 4. An ion beam 120, which has an incident angle of less than 90 deg as measured from the substrate surface, lightly sputters the patterned MTJ 104'' to remove redeposited or damaged material from the surface thereof, while the substrate 100 continuously rotates with respect to the center thereof. The incident angle and ion energy are chosen such that the ion beam 120 may slowly sputter away the side wall material 122 from the bottom electrode 102', the patterned MTJ 104', the optional patterned capping layer 106', and the bottom mask 110' without damaging the patterned MTJ 104''. The ion beam trimming process also removes a top portion 124 of the dielectric mask 114', leaving behind a partially consumed dielectric mask 114''. Ions generated from inert gases, such as but not limited to argon, xenon, and krypton, are preferred for the ion beam trimming process because inert ions do not chemically react with the side wall of the patterned MTJ 104'' to form a damaged layer. Since material removed by physical sputtering with inert ions does not readily volatilize, the sputtered material, which mostly comes from the dielectric mask 114', may redeposit onto other areas, including adjacent devices as illustrated by an exemplary trajectory 126 of the sputtered material.

Figure 1A:
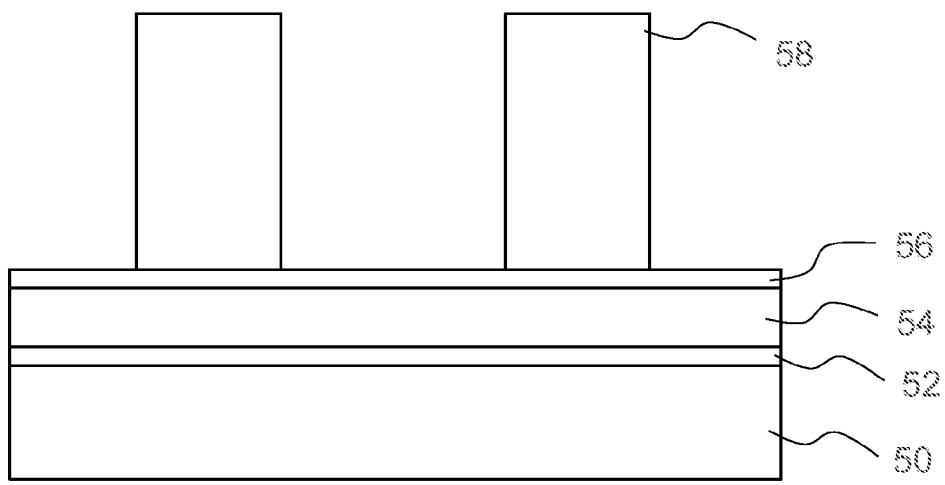
FIGS. 1A and 1B are cross sectional views of selected stages in a conventional method for forming an MTJ memory element.
Figure 1B:
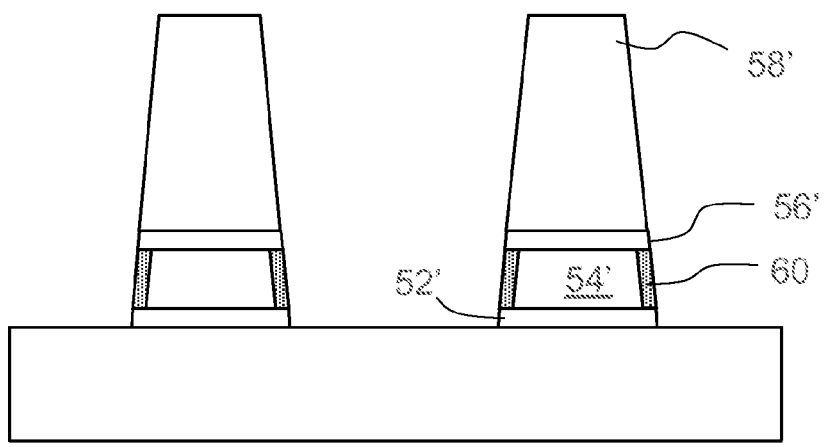
Figure 5:
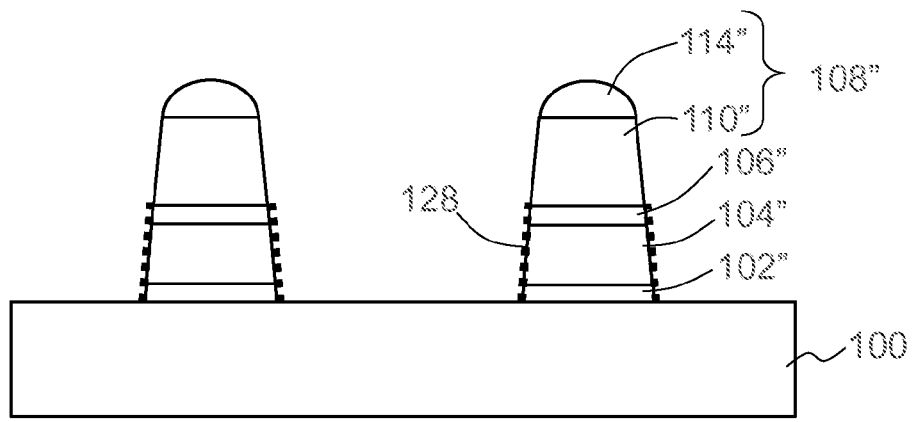

FIG. 5 illustrates the trimmed or cleaned MTJ memory element, which may have a thin redeposited layer 128 thereon. The redeposited layer 128 is mostly made of the dielectric material sputtered from the dielectric mask 114' and would not electrically shunt the patterned MTJ 104''. It should be noted that if the conventional metal mask 58' of FIG. 1B were to be used, the redeposited layer 128 would be mostly made of metal and cause shunting of the patterned MTJ 104''.

Figure 6:
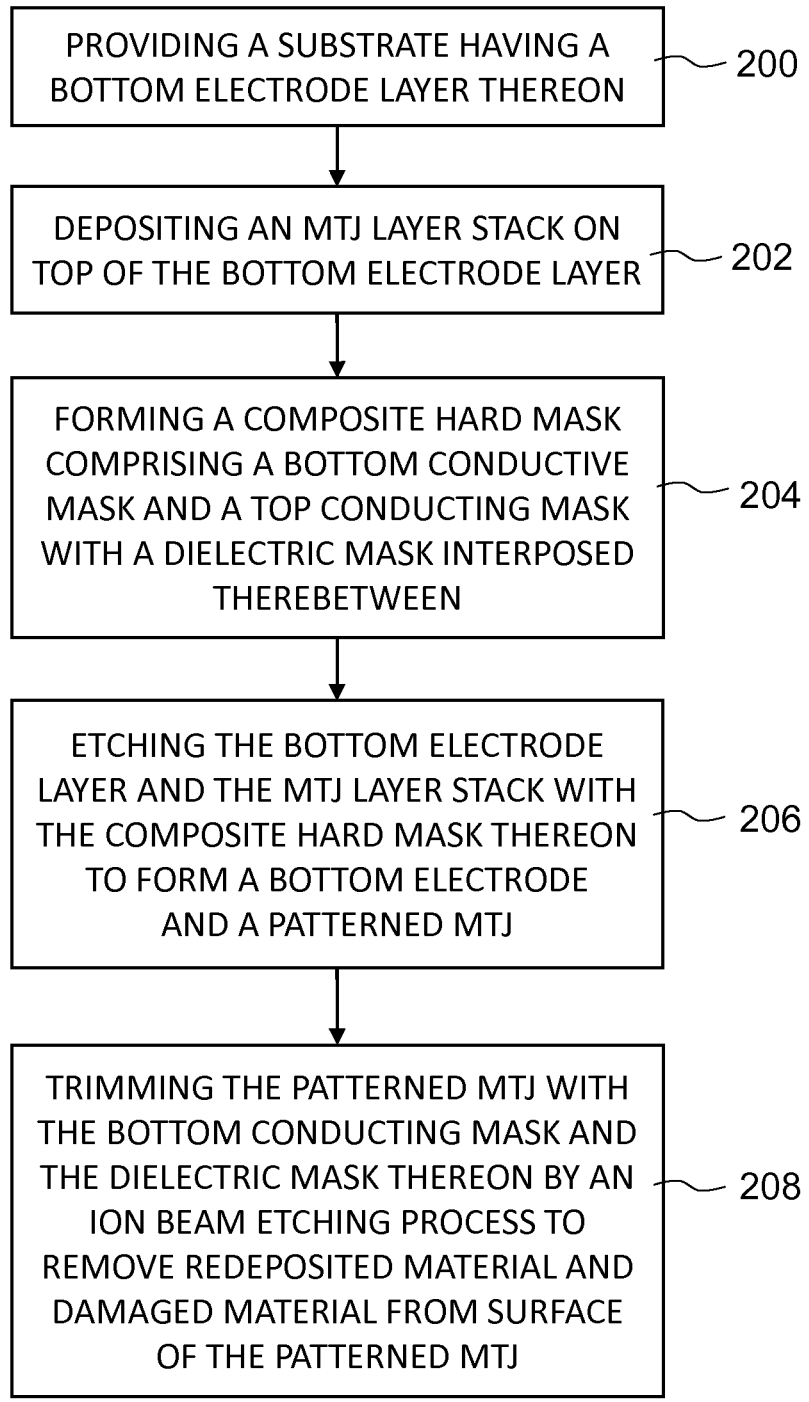
FIG. 6 illustrates selected stages in a method embodiment of the present invention corresponding to FIGS. 2-4.

FIG. 6 illustrates selected stages in a method embodiment of the present invention corresponding to FIGS. 2-4. The method comprises the steps of providing a substrate having a bottom electrode layer thereon 200; depositing an MTJ layer stack on top of the bottom electrode layer 202; forming a composite hard mask comprising a bottom conductive mask and a top conductive mask with a dielectric mask interposed therebetween 204; etching the bottom electrode layer and the MTJ layer stack with the composite hard mask thereon to form a bottom electrode and a patterned MTJ 206 while consuming the top conducting mask to expose the dielectric mask on top; trimming the patterned MTJ with the bottom conducting mask and the dielectric mask thereon by an ion beam etching process to remove redeposited material and damaged material from surface of the patterned MTJ while consuming most of the dielectric mask 208. An optional step of depositing a capping layer on top of the MTJ layer stack may be inserted between the step of depositing an MTJ layer stack 202 and the step of forming a composite hard mask 204.

Figure 7:
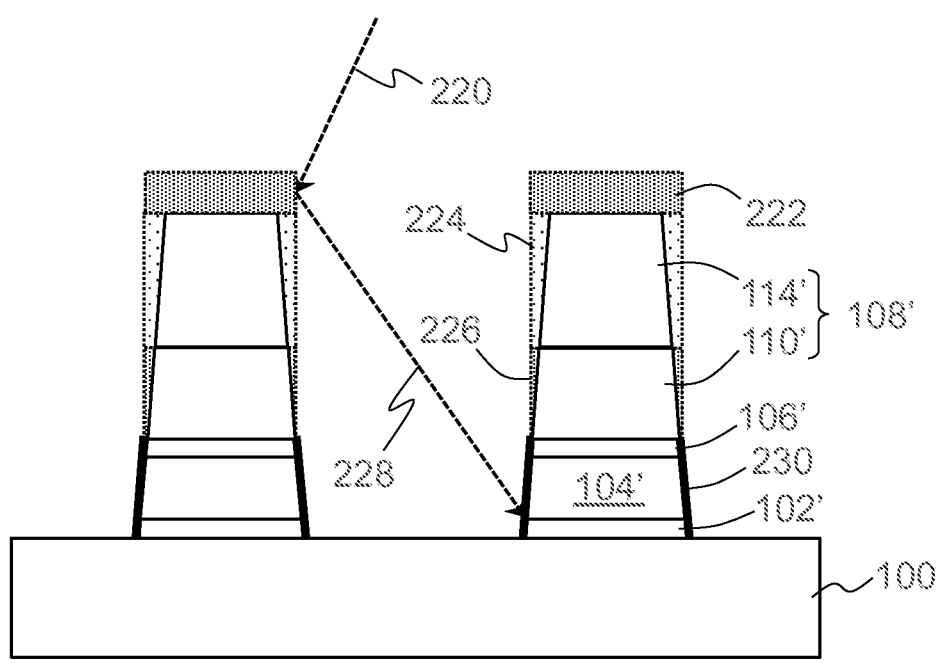
FIG. 7 is a cross sectional view illustrating an alternative etching process for forming an MTJ memory element according to another embodiment of the present invention.

The step of etching the MTJ layer stack with the composite hard mask thereon 206 may be carried out by a reactive plasma etching process illustrated in FIG. 3 or alternatively by another ion beam etching process illustrated in FIG. 7. The bottom electrode layer 102, the MTJ layer stack 104, and the optional capping layer 106 of FIG. 2 are etched by an ion beam 220 to form the bottom electrode 102', the patterned MTJ 104', and the optional patterned capping layer 106', respectively, as illustrated in FIG. 7. The MTJ etching process consumes the top mask 112 but leaves the dielectric mask 114' and the bottom mask 110' mostly intact, thereby exposing the dielectric mask 114' on top. The consumed volumes of the top mask 222, the dielectric mask 224, and the bottom mask 226 are shown in the same Figure.

The ion beam 220, which may have an incident angle of up to 90 degrees as measured from the substrate surface, removes material from the substrate surface while the substrate 100 rotates with respect to the center thereof. Unlike the ion beam trimming process for cleaning the side wall of MTJ memory element as illustrated in FIG. 4, the incident angle and ion energy of the current ion beam etching process may be chosen to maximize the material removal rate. Ions generated from inert gases, such as but not limited to argon, xenon, and krypton, are preferred for the ion beam etching process because inert ions do not chemically react with the side wall of the patterned MTJ 104' to form damaged layer. Since material removed by physical sputtering with inert ions does not readily volatilize, the sputtered material, which mostly comes from the consumed top mask volume 222, may redeposit onto other areas, including adjacent devices as illustrated by an exemplary trajectory 228 of the sputtered material. Accordingly, a redeposited conductive layer 230 may form on the side wall of the patterned MTJ 104'. The redeposited conductive layer 230 is subsequently removed by the ion beam trimming process illustrated in FIG. 4.

All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. §112, ¶ 6. In particular, the use of "step of" in the claims herein is not intended to invoke the provisions of 35 U.S.C. §112, ¶ 6.

What is claimed is:

1. A method for forming a magnetic tunnel junction (MTJ) memory element comprising the steps of:
    providing a substrate having a bottom electrode layer thereon;
    depositing a MTJ layer stack on top of said bottom electrode layer;
    forming a composite hard mask comprising a bottom conducting mask disposed on top of said MTJ layer stack and a top conducting mask with a dielectric mask interposed therebetween;
    etching said MTJ layer stack with said composite hard mask thereon to form a patterned MTJ while consuming said top conducting mask, thereby exposing said dielectric mask on top; and
    trimming said patterned MTJ with said bottom conducting mask and said dielectric mask thereon by ion beam etching to remove redeposited material and damaged material from surface of said patterned MTJ while consuming most of said dielectric mask.

2. The method of claim 1, wherein said bottom conducting mask is formed of a material selected from the group consisting of tantalum, titanium, tantalum nitride, titanium nitride, tungsten, tungsten nitride, and any combination thereof.

3. The method of claim 1, wherein said top conducting mask is formed of a material selected from the group consisting of tantalum, titanium, tantalum nitride, titanium nitride, tungsten, tungsten nitride, and any combination thereof.

4. The method of claim 1, wherein said dielectric mask is formed of a material selected from the group consisting of aluminum oxide, silicon nitride, silicon oxide, and any combination thereof.

5. The method of claim 1, wherein said MTJ layer stack comprises a magnetic reference layer and a magnetic free layer with an insulating tunnel junction layer interposed therebetween.

6. The method of claim 1, wherein said MTJ layer stack comprises:
    a perpendicular magnetic free layer;
    a perpendicular magnetic reference layer separated from said perpendicular magnetic free layer by an insulating tunnel junction layer; and
    a perpendicular magnetic fixed layer separated from said perpendicular magnetic reference layer by an antiferromagnetic coupling layer.

7. The method of claim 1, wherein the step of etching said MTJ layer stack with said composite hard mask thereon is carried out with a reactive plasma etching process that utilizes a gas chemistry comprising methanol.

8. The method of claim 1, wherein the step of etching said MTJ layer stack with said composite hard mask thereon is carried out with a reactive plasma etching process that utilizes a gas chemistry comprising carbon dioxide and hydrogen.

9. The method of claim 1, wherein the step of etching said MTJ layer stack with said composite hard mask thereon is carried out with a reactive plasma etching process that utilizes a gas chemistry comprising carbon monoxide and hydrogen.

10. The method of claim 1, wherein the step of etching said MTJ layer stack with said composite hard mask thereon is carried out with an ion beam etching process that utilizes an inert gas chemistry.

11. A method for forming a magnetic tunnel junction (MTJ) memory element comprising the steps of:
    providing a substrate having a bottom electrode layer thereon;
    depositing a MTJ layer stack on top of said bottom electrode layer;
    depositing a capping layer on top of said MTJ layer stack;
    forming a composite hard mask comprising a bottom conducting mask disposed on top of said capping layer and a top conducting mask with a dielectric mask interposed therebetween;
    etching said MTJ layer stack with said composite hard mask thereon to form a patterned MTJ while consuming said top conducting mask, thereby exposing said dielectric mask on top; and
    trimming said patterned MTJ with said bottom conducting mask and said dielectric mask thereon by ion beam etching to remove redeposited material and damaged material from surface of said patterned MTJ while consuming most of said dielectric mask.

12. The method of claim 11, wherein said bottom conducting mask is formed of a material selected from the group consisting of tantalum, titanium, tantalum nitride, titanium nitride, tungsten, tungsten nitride, and any combination thereof.

13. The method of claim 11, wherein said top conducting mask is formed of a material selected from the group consisting of tantalum, titanium, tantalum nitride, titanium nitride, tungsten, tungsten nitride, and any combination thereof.

14. The method of claim 11, wherein said dielectric mask is formed of a material selected from the group consisting of aluminum oxide, silicon nitride, silicon oxide, and any combination thereof.

15. The method of claim 11, wherein said capping layer is formed of a material selected from the group consisting of ruthenium, tantalum, titanium, tantalum nitride, titanium nitride, and any combination thereof.

16. The method of claim 11, wherein said MTJ layer stack comprises a magnetic reference layer and a magnetic free layer with an insulating tunnel junction layer interposed therebetween.

17. The method of claim 11, wherein said MTJ layer stack comprises:
  a perpendicular magnetic free layer;
  a perpendicular magnetic reference layer separated from said perpendicular magnetic free layer by an insulating tunnel junction layer; and
  a perpendicular magnetic fixed layer separated from said perpendicular magnetic reference layer by an antiferromagnetic coupling layer.

18. The method of claim 11, wherein the step of etching said MTJ layer stack with said composite hard mask thereon is carried out with a reactive plasma etching process that utilizes a gas chemistry comprising methanol.

19. The method of claim 11, wherein the step of etching said MTJ layer stack with said composite hard mask thereon is carried out with an ion beam etching process that utilizes an inert gas chemistry.

20. A method for forming a magnetic tunnel junction (MTJ) memory element comprising the steps of:
  providing a substrate having a tantalum nitride electrode layer thereon;
  depositing a MTJ layer stack on top of said tantalum nitride electrode layer, wherein said MTJ layer stack comprises:
    a perpendicular magnetic free layer;
    a perpendicular magnetic reference layer separated from said perpendicular magnetic free layer by an insulating tunnel junction layer; and
    a perpendicular magnetic pinned layer separated from said perpendicular magnetic reference layer by an antiferromagnetic coupling layer;
  depositing a ruthenium capping layer on top of said MTJ layer stack;
  forming a composite hard mask comprising a bottom titanium nitride mask disposed on top of said ruthenium capping layer and a top tantalum mask with an aluminum oxide mask interposed therebetween;
  etching said tantalum nitride electrode layer, said MTJ layer stack, and said ruthenium capping layer with said composite hard mask thereon to form a tantalum nitride electrode, a patterned MTJ, and a patterned ruthenium capping layer while consuming said top tantalum mask, thereby exposing said aluminum oxide mask on top; and
  trimming said patterned MTJ with said bottom titanium nitride mask and said aluminum oxide mask thereon by ion beam etching to remove redeposited material and damaged material from surface of said patterned MTJ while consuming most of said aluminum oxide mask.

\* \* \* \* \*